(12) United States Patent
Kronz et al.

(10) Patent No.: US 6,185,354 B1
(45) Date of Patent: Feb. 6, 2001

(54) PRINTED CIRCUIT BOARD HAVING INTEGRAL WAVEGUIDE

(75) Inventors: Jason Andrew Kronz, Duluth, GA (US); Roger J. Forse, Santa Barbara, CA (US)

(73) Assignee: Motorola, Inc., Schaumburg, IL (US)

( * ) Notice: Under 35 U.S.C. 154(b), the term of this patent shall be extended for 0 days.

(21) Appl. No.: 09/079,669

(22) Filed: May 15, 1998

(51) Int. Cl.[7] .................. G02B 6/02; H01Q 1/38
(52) U.S. Cl. ............... 385/129; 385/14; 257/758; 343/700 MS; 343/786; 333/246
(58) Field of Search .................. 385/129–132, 385/14, 28, 29; 257/758, 763, 774; 333/239, 246, 248, 250, 254; 343/700 MS, 772, 774, 771, 786

(56) References Cited

U.S. PATENT DOCUMENTS

| | | | |
|---|---|---|---|
| 4,966,430 | * 10/1990 | Weidel | 385/130 |
| 5,227,749 | * 7/1993 | Raguenet et al. | 343/700 MS |
| 5,453,154 | * 9/1995 | Thomas et al. | 216/18 |
| 5,596,336 | * 1/1997 | Liu | 343/700 MS |

OTHER PUBLICATIONS

S. Ramo, J. Whinnery, and T. Van Duzer; *Fields and Waves in Communication Electronics* (Second Ed. 1984), pp. 411–422.

* cited by examiner

*Primary Examiner*—Hemang Sanghavi
(74) *Attorney, Agent, or Firm*—Douglas D. Fekete

(57) ABSTRACT

A printed circuit board comprises a metallic layer (12) cooperating with a metallic plate (26) to form a generally polygonal cross-section (48) of an integral waveguide (46) filled with a solid dielectric layer. The metallic layer (12) is on a substrate (10). The metallic layer (12) has a first strip (14) and a second strip (16) spaced apart from the first strip (14). A solid dielectric layer (18) overlies the metallic layer (12). The solid dielectric layer (18) has a first channel (36) exposing the first strip (14), a second channel (38) exposing the second strip (16), and a land (34) disposed between the first channel (36) and the second channel (38). A metallic plate (26) overlies the land (34), extends through the first channel (36) to the first strip (14), and extends through the second channel (38) to the second strip (16).

30 Claims, 3 Drawing Sheets

PRINTED CIRCUIT BOARD HAVING INTEGRAL WAVEGUIDE

FIELD OF THE INVENTION

This invention relates to a printed circuit board including an integral waveguide; and more particularly, this invention relates to an integral waveguide formed of a metallic layer on a substrate, a solid dielectric layer overlying the metallic layer and having channels, and a metallic plate connected to the metallic layer through the channels.

BACKGROUND OF THE INVENTION

In electronic assemblies, it is known to use transmission lines to transmit an electromagnetic signal between components on a printed circuit board. Microstrip and strip line are illustrative examples of transmission lines which are used to transmit electromagnetic signals between components on a printed circuit board. Microstrip and stripline feature planar metallic conductors that are readily amenable to fabrication during the construction of a printed circuit board.

Microstrip comprises a conductive strip separated from a ground plane by a dielectric layer. Stripline comprises a central conductive strip adjoined by two dielectric layers. The two dielectric layers separate the central conductive strip from two ground planes. Microstrip and stripline technology have been improved primarily by the introduction of new dielectrics which offer lower propagational loss. However, because propagation in microstrip and stripline is limited to the transverse electric mode, microstrip and stripline may be cumbersome to tune. Moreover, the single propagational mode combined with dielectric constraints confluence to form practical operating impedance limitations for microstrip and stripline technology.

It is known to use waveguides, such as hardlines, to transmit electromagnetic signals between different circuit boards. Waveguides generally offer lower propagational loss than microstrip and stripline and greater isolation of electromagnetic radiation than microstrip and stripline do. Waveguides may also offer increased ability for controlling impedances than microstrip and stripline line do.

A waveguide typically has a hollow cross-section, which determines the propagation mode and the cut-off frequency of electromagnetic radiation transmitted by the waveguide. The complexity of manufacturing suitable elliptical, circular, and rectangular cross sections has prevented the incorporation of integral waveguides into printed circuit boards. Thus, while metallic waveguides with sundry geometrical cross-sections are commercially available as discrete transmission line components, so far microstrip and stripline technology generally reflect the limited extent of waveguide incorporation into printed circuit boards of commercially available products.

The impedance of microstrip and stripline is determined by the width of the conductive strip, the thickness of the dielectric layer or layers, and the dielectric constant of the dielectric material. If the thickness of the dielectric material is sufficiently thin, such as 50 microns or thinner, then manufacturing tolerances must be carefully controlled to compensate for potential variances in the dielectric thickness. Variances in dielectric thickness may cause line impedance mismatches. Even slight variations in the dielectric thickness of ten to fifteen microns can detrimentally affect the impedance of stripline or microstrip, in which a dielectric layer is 50 microns or thinner. Batch-to-batch variations in the dielectric material properties further contribute to impedance mismatches associated with transmission line using thin dielectric layers of 50 microns or less. While many commercially available discrete waveguides offer uniform impedances, the difficulty and expense of integrating discrete waveguides into printed circuit boards has discouraged the use of integral waveguides to facilitate impedance matching of intraboard signals.

Thus, a need exists for an integral waveguide for intraboard connections of a printed circuit board. In addition, a need exists for an integral waveguide that can provide a substantially constant impedance despite ordinary variations in dielectric thickness from manufacturing procedures.

BRIEF SUMMARY OF THE INVENTION

In accordance with this invention, a printed circuit board comprises a metallic layer on a substrate. The metallic layer has a first strip and a second strip spaced apart from the first strip. A solid dielectric layer overlies the metallic layer and features a first channel exposing the first strip, a second channel exposing the second strip, and a land disposed between the first channel and the second channel. A metallic plate overlies the land, extends through the first channel to the first strip, and extends through the second channel to the second strip.

In this manner, the metallic layer and the metallic plate cooperate to form a waveguide about the dielectric layer. Thus, this invention provides a waveguide on a printed circuit board that is compatible with standard manufacturing techniques for fabricating a printed circuit board. In one aspect of this invention, a horn antenna is connected to the waveguide to transfer electromagnetic energy to and/or from the waveguide.

DETAILED DESCRIPTION OF THE PREFERRED EMBODIMENTS

Figure 1:
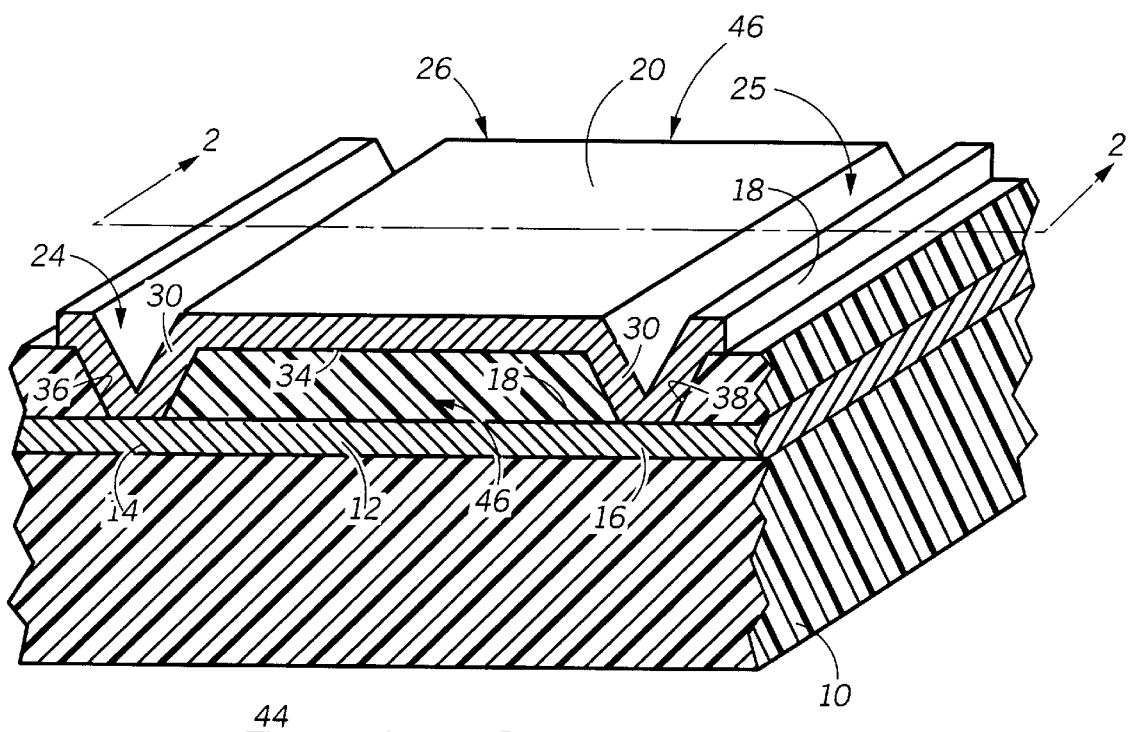
FIG. 1 is a perspective view of a printed circuit board having an integral waveguide in accordance with this invention.
Figure 2:
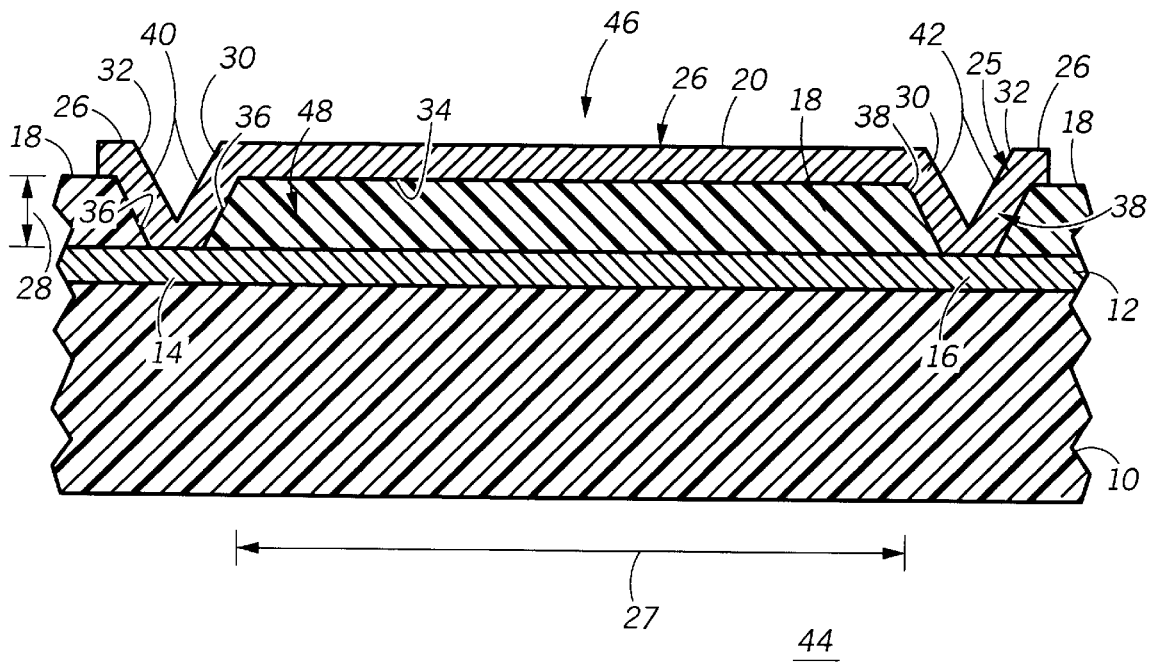
FIG. 2 is a cross-sectional view as viewed along reference line 2—2 of FIG. 1.

In accordance with a preferred embodiment of this invention, as illustrated in FIG. 1 and FIG. 2, a portion of a printed circuit board 44 includes an integral waveguide 46. The printed circuit board 44 comprises a metallic layer 12 on a substrate 10. The metallic layer 12 has a first strip 14 and a second strip 16 generally equidistantly spaced apart from the first strip 14. A solid dielectric layer 18 overlies at least a portion of the metallic layer 12. The solid dielectric layer 18 has a first channel 36 exposing the first strip 14, a second channel 38 exposing the second strip 16, and a dielectric land 34 extending between the first channel 36 and the second channel 38. A metallic plate 26 overlies the land 34, extends through the first channel 36, and extends through the second channel 38. The metallic layer 12 and the metallic plate 26 cooperate to form a waveguide 46 having a generally polygonal cross section.

The substrate 10 is formed a dielectric material. In this embodiment, substrate 10 is a glass fiber-reinforced polymeric composite, such as a substrate commonly known as FR4. Alternately, substrate 10 may be formed of a ceramic material, a polymer, a composite, or any other suitable electrically insulating material.

The metallic layer 12 may partially or entirely overly the substrate 10. The metallic layer 12 overlies the substrate 10 at least in the region of the waveguide 46. The metallic layer 12 includes a first strip 14 and a second strip 16, which extend in an elongated manner across the metallic layer 12. The first strip 14 and the second strip 16 are preferably spaced equidistantly apart. In this example, strips 14 and 16 are depicted as generally linear and parallel.

The solid dielectric layer 18 is composed of any dielectric material having a suitably low attenuation for propagating electromagnetic radiation within the waveguide 46. The solid dielectric layer 18 may cover the entire printed circuit board 44 and at least covers a portion of the metallic layer 12 between the first strip 14 and the second strip 16. In practice, the dielectric layer 18 may cover the entire printed circuit board 44 to provide mounting surfaces for components in other regions of the printed circuit board 44.

The solid dielectric layer 18 is preferably formed of a polymeric material that is susceptible to photofabrication. For this purpose, the preferred polymeric material comprises a polymeric precursor and a dispersed photosensitive agent. The preferred polymeric material may be selectively actuated to polymerize the dielectric layer 18 and to define the first channel 36 and the second channel 38 in the dielectric layer 18. The photosensitive agent may be a negative-acting or positive-acting agent that produces a photo-activated physical and/or chemical change in an exposed region of the polymeric material. The photosensitive agent directly or indirectly modifies the differential solubility of an exposed region of the polymeric polymeric material relative to an unexposed region of the polymeric polymeric material underlying a photomask. The exposed region refers to an irradiated portion of the polymeric polymeric material that is exposed to electromagnetic radiation. The exposure energy, as measured by the time and intensity of the electromagnetic irradiation, is selected to yield a desired contrast between the exposed region and unexposed region. The differential solubility is realizable after irradiation during exposure to a developer, which clearly differentiates the exposed region from the unexposed region. The developer may comprise a solvent, a caustic aqueous solution, an emulsifier, or the like. The developer is capable of dissolving the exposed region for a positive-acting photosensitive agent or the developer is capable of dissolving the unexposed region for a negative-acting photosensitive agent.

The first channel 36 and the second channel 38 are initially defined by irradiating the photosensitive polymeric material with ultraviolet light to first change the differential solubility of the polymeric material. If a positive-acting photosensitive agent is used, a photomask protects the unexposed region that is insoluble relative to the exposed regions which are rendered soluble from the ultraviolet light. The exposed region is immersed in a developer to remove the relatively soluble, exposed regions thereby forming the first channel 36 and the second channel 38.

The polymeric material is capable of adequately bonding to the substrate 10 for printed circuit board applications. The adhesion between the polymeric precursor and the substrate 10 is maximized by bonding the polymeric material to the substrate 10 while the polymeric material is a B-stage polymer, a partially cured polymer, an uncured polymer, a nonpolymerized polymeric precursor, a noncross-linked pre-polymeric material, or the like. The solid dielectric layer 18 may be made from a photosensitive epoxy acrylic blend, which is commercially available from Ciba-Geigy under the tradename Ciba Probelec 7082.

The metallic plate 26 comprises a trace 20, a first elongated metallized via 24, and a second elongated metallized via 25. The solid dielectric layer 18 separates the trace 20 from the metallic layer 12. The trace 20 is preferably oriented substantially parallel to the metallic layer 12. The trace 20 and the metallic layer 12 preferably form a first set of opposing sides of the waveguide 46.

The first elongated metallized via 24 and the second elongated metallized via 25 preferably form a second set of opposing sides of the waveguide 46. The first metallized via 24 extends through the first channel 36 and electrically connects the trace 20 to the metallic layer 12. The second elongated metallized via 25 extends through the second channel 38 and electrically connects the trace 20 to the metallic layer 12. The first elongated metallized via 24 and the second elongated metallized via 25 are electrically and mechanically connected (i.e. fused) to the first strip 14 and the second strip 16, respectively. The first elongated metallized via 24 and the second elongated metallized via 25 result from plating, additive plating, electroless deposition, or other suitable methods of applying the metallic plate 26 to the first channel 36 and the second channel 38.

The first elongated metallized via 24 and the second elongated metallized via 25 optimally have inner metallic walls 30 that are substantially orthogonal to the trace 20 such that the polygonal cross section is substantially rectangular to permit propagation in at least one transverse electric mode or at least one transverse magnetic mode. However, the polygonal cross section may have shapes ranging from generally rectangular to generally trapezoidal, depending upon the manufacturing process.

The positive slope for the inner metallic walls 30, as illustrated in FIG. 1 and FIG. 2, typically is the result of a shadow effect from the photomask. The positive slope of the inner metallic walls 30 is a feature attendant with a photosensitive polymeric resin used for manufacturing the solid dielectric layer 18. The positive slopes of the inner metallic walls 30 or side walls are exaggerated as shown in FIG. 1 and FIG. 2. The first elongated metallized via 24 and the second elongated metallized via 25 may have outer walls 32 in addition to the inner metallic walls 30. Accordingly, the channel cross sections of the first channel 36 and the second channel 38 may be somewhat V-shaped relative to the trace 20. However, etching the first channel 36 and the second channel 38 with a solvent prior to plating or electroless deposition of the inner metallic walls 30 tends to make them negatively sloped or retrograde. Orthogonal inner metallic walls 30 are possible, but sometimes difficult to obtain because of onerous process control parameters. Therefore, the manufacturing process is typically optimized by biasing the process toward primarily yielding positively sloped walls, as shown, which secondarily yields orthogonal walls to the substantial exclusion of undesirable retrogradely sloped walls.

The shape of the polygonal cross section may be optimized by laser trimming after photofabrication of the first channel 36 and the second channel 38, but preferably prior to metallization of the first channel 36 and the second channel 38. During optimization the inner metallic walls 30 of the first elongated metallized via 24 and the second elongated metallized via 25 may be made more orthogonal to the trace 20 such that the cross section of the waveguide 46 is generally rectangular. Rectangular waveguides have readily predictable propagational modes, cut-off frequencies, and impedances.

The metallic layer 12, the metallic plate 26, the first elongated metallized via 24 and the second elongated metallized via 25 generally are composed of a metal selected from the group consisting of copper, nickel, tin, iron and aluminum. Alloys of two or more of the foregoing metals may be used to form the metallic layer 12 and the metallic plate 26. In a preferred embodiment, the metallic layer 12, the metallic plate 26, the first elongated metallized via 24 and the second elongated metallized via 25 preferably are formed of copper, which may be electrolessly deposited or electroplated, or applied by other suitable means.

The polygonal cross section of the resultant waveguide 46 preferably has at least one dimension selected to permit propagation of microwave energy in at least one propagational mode above a selected cut-off frequency. The polygonal cross section has an internal height 28 and an internal width 27. If the width 27 varies because of a trapezoidal deviation from a true rectangular cross section of the waveguide 46, the minimum width may be used for estimating the cut-off frequency of the waveguide 46. The height 28, the width 27, a dielectric permittivity of the solid dielectric layer 18, a dielectric permeability of the solid dielectric layer 18, a wavenumber (i.e. velocity factor) of the solid dielectric layer 18 are among the factors that primarily determine the cut-off frequency of the waveguide 46 for most propagational modes. The polygonal cross section of the present invention is generally adapted to permit propagation of microwaves in transverse magnetic wave modes, transverse electric wave modes, or both. In accordance with the preferred embodiment, the operational frequency range of interest is generally greater than 5 Gigahertz (GHz) and more preferably equal to or greater than a cutoff frequency of 7 GHz.

The characteristic impedance of the waveguide 46 for a given propagational mode may be expressed as a function of the ratio of the height 28 to the width 27 of the waveguide 46 for many propagational modes. A preferred cross-sectional ratio of height 28 to width 27 for practicing the invention ranges from approximately 0.4 to 1.7 for an operational frequency range of interest. A cross-sectional ratio of approximately 1.35 achieves a desired characteristic impedance within a range of approximately 50 to 75 ohms.

In accordance with the preferred embodiment wherein the solid dielectric layer 18 is formed from conventional photosensitive polymeric materials, the dielectric thickness may suitably be within a range from approximately 25 to 75 microns because of the inherently limited penetration of electromagnetic energy into the polymeric material. Therefore, not only may the height 28 of the waveguide cross section 48 be limited, but the lowness of the cut-off frequency also may be limited in accordance with the photofabrication process used to form the first channel 36 and the second channel 38. The theoretical maximum height 28 of the waveguide 46 is approximately 75 to 80 microns for most currently commercially available photosensitive polymeric resins exposed to ultraviolet light with an exposure energy of less than or equal to 750 mJ/cm$^2$. Through experimental fabrication of trial printed circuit boards in accordance with teachings of this invention, maximum heights of 50 microns were found to be readily achievable with commercially available photosensitive polymeric materials and exposures less than or equal to exposure energies of 750 mJ/cm$^2$ of the ultraviolet light. As a result, the integral waveguide 46 of this invention is readily adapted for operation at cutoff frequencies of 7 GHz and higher.

In an alternate embodiment of this invention, waveguides having lower frequencies than 7 GHz are achievable by increasing the dielectric thickness above 80 microns. The dielectric thickness may be increased by using processing available for the manufacture of a multi-layered circuit board. For example, if resin-coated copper (RCC) laminate is used with laser ablation, waveguides optimized for lower operational frequencies than 7 GHz, or otherwise permitted by photofabrication, may be constructed in accordance with this invention. The dielectric thickness may be enhanced by applying a resin-coated metallic laminate, such as a resin-coated copper (RCC) laminate, with a first solid dielectric stratum to a substrate having a second solid dielectric stratum. The first solid dielectric stratum and the second solid dielectric stratum aggregately yield a solid dielectric strata having a combined thickness of the first solid dielectric stratum plus the second solid dielectric stratum. The dielectric strata of enhanced thickness secondly is laser ablated, laser etched, or mechanically routed, and/or exposed to intense electromagnetic radiation above 750 mJ/cm$^2$ to produce deeper via channels than are producible by conventional photofabrication techniques using photosensitive polymeric precursors. A metallic plate, including metallization of the channels, is plated to form a continuous metallization. Accordingly, if fabrication methods other than photofabrication are used, the maximum height and the maximum width of the polygonal cross section 48 may be increased.

Thus, in an alternate embodiment of this invention, the waveguide may have an internal height 28 of up to 200 microns or more, based upon the dielectric thickness of the dielectric layer, referred to as the dielectric strata. Preferably, the dielectric thickness generally is between approximately 25 microns and 200 microns for the illustrative examples of the invention described herein. Dielectric thicknesses less than 25 microns involve high propagational frequencies beyond the range presently commonly found in microelectronic devices. Moreover, impedance uniformity is difficult to maintain for dielectric thicknesses of less than 25 microns because even minor variations in dielectric thickness from the manufacturing process may cause impedance mismatches. At the other end of the spectrum, while heights greater than 200 microns offers the possibility of lower frequency waveguides, heights greater than 200 microns may be considered too large for integration into printed circuit boards in comparison to microstrip and stripline transmission lines of comparable frequencies. Any upper-bound limit on the size of the waveguide 46 should be determined primarily based on density objectives of the printed circuit board 44. For example, waveguides fabricated with RCC lamination may meet density objectives for typical portable consumer products where the height 28 of the polygonal cross section 48 of the waveguide 46 is preferably less than or equal to approximately 200 microns. Meanwhile, the corresponding width 27 of the polygonal cross section 48 of the waveguide 46 is less than or equal to approximately 270 microns.

If laser ablation or mechanical routing is used to fabricate the first channel and the second channel in the solid dielectric layer, any type of dielectric materials could be used to practice this invention, rather than the preferred photosensitive polymeric precursor. Thus, in an alternate embodiment non-polar or low-loss dielectric materials such as polytetrafluoroethylene could be used to form the solid dielectric layer.

One advantage of this is invention is that it provides a substantially uniform impedance despite minor variations in dielectric thickness. If the dielectric thickness varies while manufacturing the printed circuit board 44 of this invention in accordance with photofabrication methods, the characteristic impedance of the waveguide 46 may be kept uniform by manufacturing a waveguide 46 having a slightly oversize height than theoretically required for a particular cut-off frequency and the propagational mode. If the variations in height 28 are significant or greater than approximately thirty percent of the desired height, height discontinuities in the metallic plate 26 spanning the width 27 may produce observable fringe or excess capacitance that contribute to the total capacitance of the waveguide 46. If the waveguide 46 is slightly higher than required for a particular desired cut-off frequency, the fringe capacitance may counteract decreases in the direct capacitance of the waveguide 46 from the oversize height, such that the characteristic impedance of the waveguide 46 tends to remain uniform. However, for cases where the height discontinuity makes the waveguide shorter than desired for a particular cut-off frequency, the fringe capacitance is not expected to stabilize the impedance of the waveguide 46. Therefore, in manufacturing the waveguide, manufacturing tolerances may be skewed toward making the dielectric thickness slightly oversize from the desired thickness to capture the full advantages of the balancing between fringe capacitance and direct capacitance that tend to maintain a uniform characteristic impedance.

In an alternate embodiment, the metallic layer is patterned to form a first trace and the metallic plate includes a second trace. The first trace and the second trace have planar contours which generally follow or track each another. The planar contours may have generally rectangular, generally curved shapes, or a combination of rectangular and curved shapes. The actual shapes of the planar contours may be determined by routing requirements of the printed circuit board and available space on the board, along with considerations to avoid discontinuities that produce impedance mismatches. The first elongated metallized via, the second elongated metallized via, the first trace, the second trace, and the inner walls intersect one another to form the polygonal cross section of a waveguide, which may be rectangular, trapezoidal, or the like.

Figure 3:
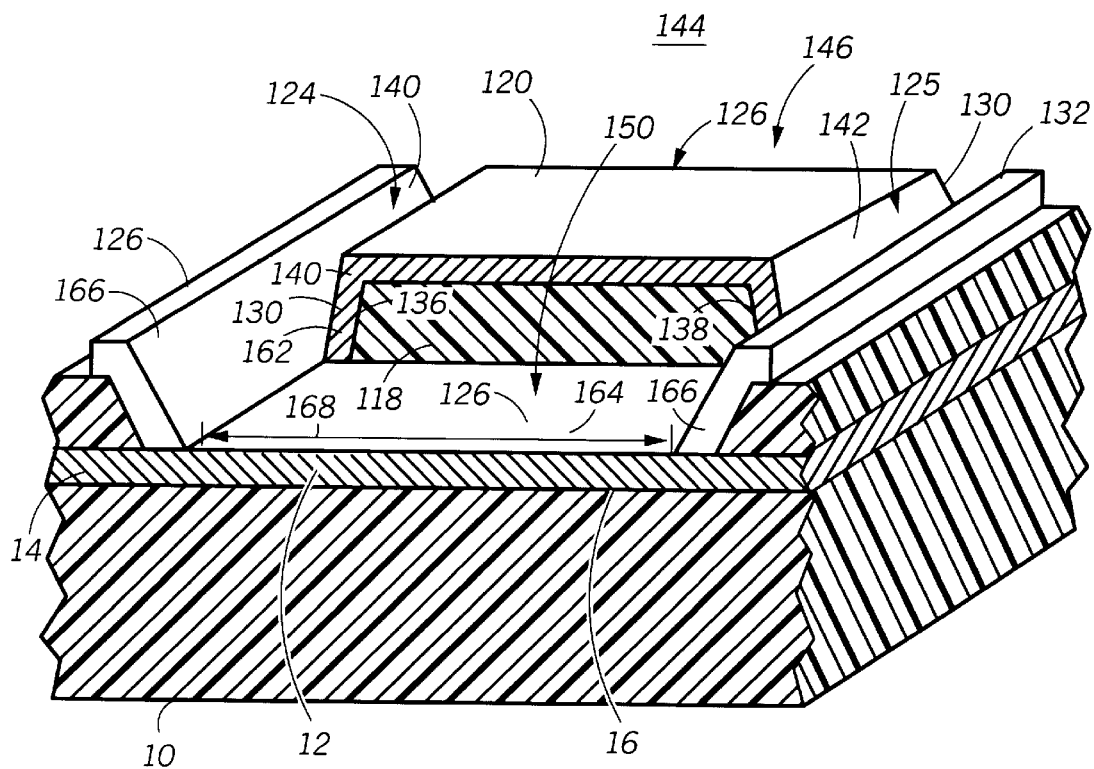
FIG. 3 is a perspective view of a printed circuit board having an integral waveguide adapted for connection to a horn antenna in accordance with an alternate embodiment of this invention
Figure 4:
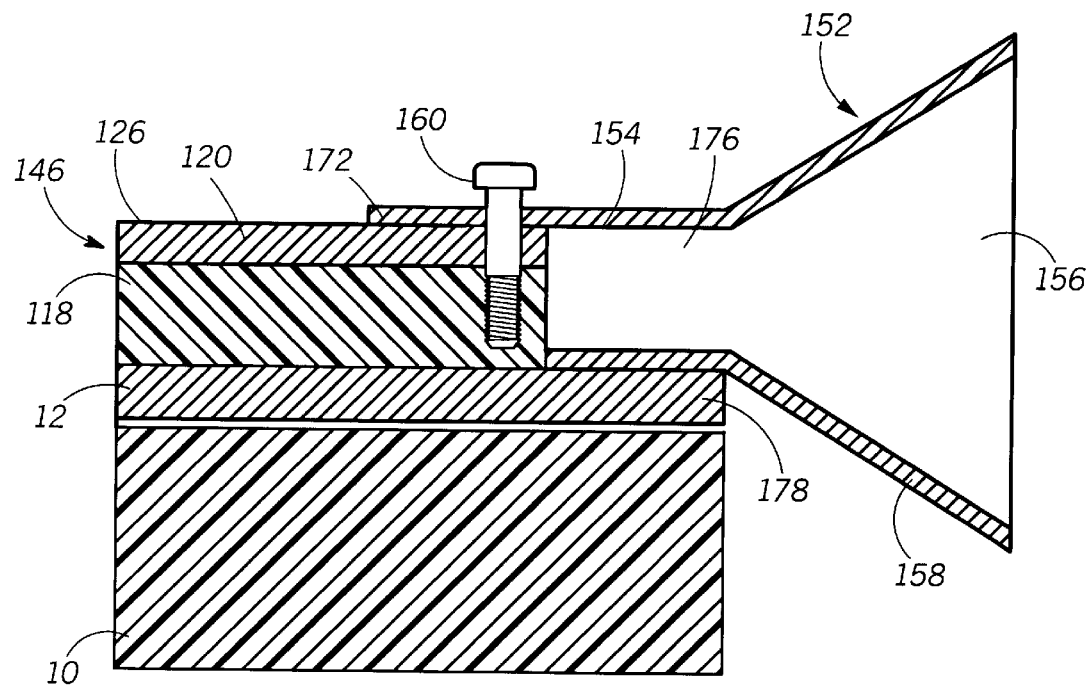
FIG. 4 is a cross-sectional side view of the printed circuit board in FIG. 3 following connection of the horn antenna to the waveguide.

FIG. 3 and FIG. 4 show a further embodiment in which a waveguide is terminated to mate with a horn antenna 152. The waveguide 146 shown in FIG. 3 and FIG. 4 is similar to waveguide 46 of FIG. 1 and FIG. 2. In addition, waveguide 146 includes a horn groove 150 resulting from the removal of a generally polyhedral section of the solid dielectric layer 118, adjacent to the edge of the substrate 10. The removal of the polyhedral section may be accomplished by photofabrication of the solid dielectric layer 118, laser ablation, mechanical routing, etching, or the like. The removal preferably takes place prior to any metallization of the solid dielectric layer 118. If photofabrication is initially used, laser ablation may be necessary to trim the results of photo fabrication used to remove the polyhedral section in a geometrically true manner. A first channel 136 and a second channel 138 may also be made through photo fabrication.

The waveguide 146 has a metallic plate 126 comprising the horn groove 150, a trace 120, a first elongated metallized via 124, and a second elongated metallized via 125. The horn groove 150 preferably has a conductive bottom 164 and conductive walls 166. The conductive bottom 164 is generally rectangular and planar. The conductive bottom 164 has a groove width 168 bounded by the conductive walls 166. The conductive walls 166 represent a coextensive continuation of the outer walls 132 of the first elongated metallized via 124 and the second elongated metallized via 125. The conductive bottom 164 and the conductive walls 166 may be formed by additive plating, electroless plating, RCC lamination, any combination of the foregoing techniques, or other suitable fabrication techniques. The groove width 168 may be widened as necessary to accommodate solder, conductive adhesive, braze, or the like for fastening the horn antenna 152 to the waveguide near the junction of the horn antenna 152 and the conductive bottom 164. The horn groove 150 is bounded by conductive ends 162 of the waveguide 146. The conductive ends 162 are associated with the inner walls 130 of the first elongated metallized via 124 and the second elongated metallized via 125.

Figure 5:
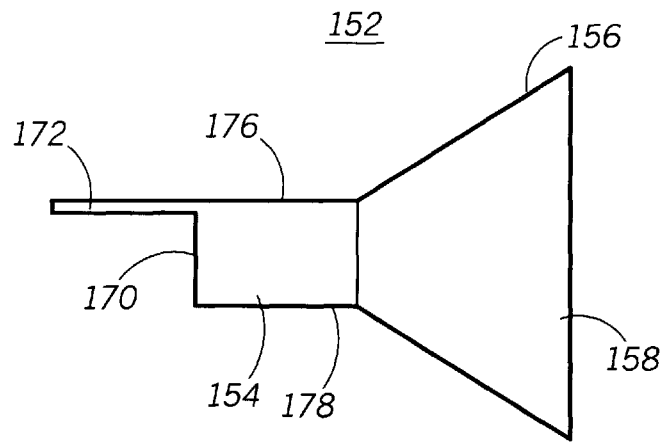
FIG. 5 is a side view of a horn antenna shown in FIG. 4.
Figure 6:
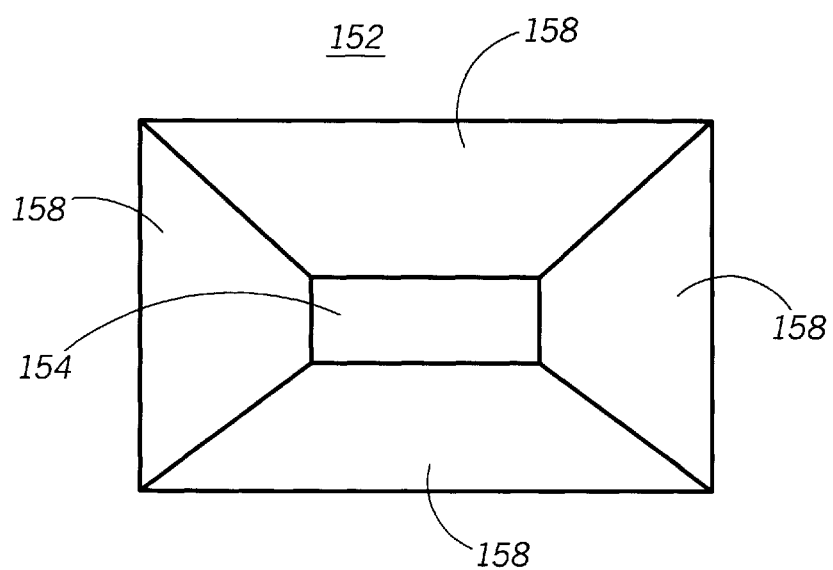
FIG. 6 is an end view of the horn antenna of FIG. 5.

FIG. 5 and FIG. 6 illustrate the horn antenna 152 which may be integrated into the printed circuit board 172. The horn antenna 152 has a connecting section 154 with a mating flange 172. The connecting section 154 preferably is hollow, generally rectangular, and forms a waveguide having an air dielectric. The mating flange 172 extends from a top side 176 of the connecting section 154 and remotely located from the waveguide. In an alternate embodiment, the bottom side 178 of the connecting section 154 may be omitted to form a three-sided, orthogonal hollow section.

The connecting section 154 has mating edges 170 which are adapted to abut the conductive ends 162 and to accept solder to mechanically and electrically connect or fuse the horn antenna 152 to the printed circuit board. The junction between the mating edges 170 and the conductive ends 162 may be fillet connection, a butt connection, a flange connection, an end-to-end connection, or another electrically conductive and mechanically sound, suitable connection.

The horn antenna 152 comprises a flared section 156 adjoining the connecting section 154. The flared section 156 is preferably hollow, tapered, and forms a radiator for electromagnetic energy carried to or from the integral waveguide. As illustrated in FIG. 5 and FIG. 6, the flared section 156 includes four substantially triangular sides 158 that are tapered inward toward the connecting section 154 and extend outward toward an opening. Each of the triangular sides 158 is connected to a corresponding side of the connecting section 154. The triangular sides 158 are preferably planar. The flared section 156 is a somewhat obeliscal, horn-like structure which is preferably cast of aluminum to minimize manufacturing costs, rather than fabricating the flared section 156 by welding or fusing sheet stock together.

The mating flange 172 overlies the trace 120 and may be fastened to the trace 120 with one or more fasteners 160. A suitable fastener 160 may include a machine screw, a bolt, a rivet, a stud, or the like. The fastener 160 may be permitted to extend into a corresponding recess in the solid dielectric layer 118 for tuning the waveguide or modifying its characteristic impedance. The trace 120 and/or the mating flange 172 may be threaded to allow the fastener length that extends into the solid dielectric layer 118 to be adjusted for inductive tuning of the waveguide. The fastener 160 extending into the polygonal (i.e. rectangular) waveguide has an inductive affect upon the overall impedance resulting from interaction of electric and/or magnetic fields with the discontinuity of the fastener 160 for certain propagational modes. The horn antenna 152 may also be soldered to the trace 120 for increased metallic strength and to avoid the potential for intermodulation products formed by the oxidation of an unsoldered electrical junction. The horn antenna 152 must be mounted on or near the edge of the hosting printed circuit board 144.

Thus, this invention provides a printed circuit board with an integral waveguide that is generally fabricated contemporaneously with traces and other features of the printed circuit board. The printed circuit board with the integral waveguide may be fabricated by using traditional negative-acting photosensitive techniques that are commonly employed in the manufacture of printed circuit boards. The integral waveguide may be readily terminated with a horn antenna for transmission and receipt of microwave signals. The directly-connected horn antenna can minimize connector losses and attendant attenuation in comparison to transmission configurations that couple discrete waveguide between a horn antenna and a printed circuit board.

In comparison to microstrip and stripline transmission lines, the integral waveguide is capable of lower loss and greater electromagnetic isolation between the electromagnetic signal carried by the integral waveguide and surrounding components on the printed circuit board. The waveguide contains the electromagnetic fields by physically surrounding the carried electromagnetic signal, whereas stripline and microstrip radiate more substantial a portion of the electromagnetic signal to surrounding components on the printed circuit board. The tunability of generally rectangular waveguides, which may be inductively tuned by the fastener, tends to make impedances of the integral waveguide more controllable than microstrip and stripline are.

Various illustrative examples of the printed circuit board having an integral waveguide have been described in this specification. Additional variations of the examples described above may be apparent from this specification. Accordingly, the scope of the present invention is defined by reference to the following claims which are further exemplary of the present invention.

The following is claimed:

1. A printed circuit board including an integral waveguide comprising:
   a substrate,
   a metallic layer on the substrate, the metallic layer having a first strip and a second strip spaced apart from the first strip;
   a solid dielectric layer overlying the metallic layer, the solid dielectric layer having a first channel exposing the first strip, a second channel exposing the second strip, and a land between the first channel and the second channel; and
   a metallic plate overlying the land and extending through the first channel in contact with the first strip, and extending through the second channel in contact with the second strip; the metallic layer and the metallic plate cooperating to form the integral waveguide.

2. The printed circuit board according to claim 1 wherein the solid dielectric layer is composed of a polymer.

3. The printed circuit board according to claim 1 wherein the solid dielectric layer is composed of a photodefinable polymer; and wherein the first channel and the second channel are defined by irradiating the photodefinable polymer and developing to remove a portion of the polymer to expose the first strip and the second strip.

4. The printed circuit board according to claim 1 wherein the waveguide has a generally rectangular cross section.

5. The printed circuit board according to claim 1 wherein the waveguide has a generally trapezoidal cross section.

6. The printed circuit board according to claim 1 wherein the metallic layer and the metallic plate are composed substantially of a metal selected from the group consisting of copper, iron, nickel, tin, and aluminum.

7. The printed circuit board according to claim 1 wherein the solid dielectric layer has a dielectric thickness effective for propagating a microwave signal.

8. The printed circuit board according to claim 7 wherein the dielectric thickness is within a range from approximately 25 microns to 200 microns.

9. The printed circuit board according to claim 1 wherein the waveguide has an internal height and an internal width effective to propagate a microwave signal in a mode having a cut-off frequency of greater than 5 Gigahertz.

10. A printed circuit board including a polymer-filled waveguide comprising:
    a polymeric substrate,
    a metallic layer on the polymeric substrate, the metallic layer having a first strip and a second strip equidistantly spaced apart from the first strip;
    a polymeric layer overlying the metallic layer, the polymeric layer having a first channel exposing the first strip, a second channel exposing the second strip, and a land between the first channel and the second channel; and
    a metallic plate comprising a trace affixed to the land and parallel to the metallic layer, a first elongated metallized via extending through the first channel in contact with the first strip, and a second elongated metallized via extending through the second channel in contact with the second strip; the metallic layer and the metallic plate cooperating to form the polymer-filled waveguide.

11. The printed circuit board according to claim 10 wherein the polymeric layer is formed from a photodefinable polymeric material.

12. The printed circuit board according to claim 10 wherein the metallic layer and the metallic plate are formed of copper.

13. The printed circuit board according to claim 10 wherein the waveguide has an internal height substantially equal to a dielectric thickness of the polymeric layer.

14. The printed circuit board according to claim 10 wherein the first elongated metallized via is substantially parallel to the second elongated metallized via.

15. The printed circuit board according to claim 10 wherein the waveguide is generally trapezoidal.

16. The printed circuit board according to claim 10 wherein the waveguide is generally rectangular.

17. The printed circuit board according to claim 10 wherein the polymeric layer has a first stratum adjacent the metallic layer and a second stratum adjacent to the trace, the first stratum and the second stratum having a combined dielectric thickness of greater than 80 microns.

18. The printed circuit board according to claim 10 wherein the polymeric layer is formed of a single stratum and has a dielectric thickness approximately between 25 and 75 microns.

19. The printed circuit board according to claim 10 further comprising a cross-sectional ratio of an internal height to an internal width of the waveguide, the cross-sectional ratio ranging from approximately 0.4 to 1.7.

20. The printed circuit according to claim 10 wherein the metallic plate comprises a resin-coated metallic foil laminated onto the polymeric dielectric layer, and wherein the waveguide has a height between the trace and the metallic layer and width between the first elongated metallized via and the second elongated metallized via; the height being less than or equal to approximately 200 microns and the width being less than or equal to approximately 270 microns.

21. A printed circuit board including a polymer-filled waveguide comprising:
- a polymeric substrate,
- a metallic layer on the polymeric substrate, the metallic layer having a first strip and a second strip generally equidistantly spaced apart from the first strip;
- a polymeric layer overlying the metallic layer, the polymeric layer having a first channel exposing the first strip, a second channel exposing the second strip, and a land between the first channel and the second channel;
- a metallic plate comprising a trace affixed to the land and parallel to the metallic layer, a first elongated metallized via extending through the first channel in contact with the first strip, and a second elongated metallized via extending through the second channel in contact with the second strip; the metallic layer and the metallic plate cooperating to form a polymer-filled waveguide, said waveguide having an end, and
- a horn antenna connected to the end of the waveguide for propagating electromagnetic energy to and from the waveguide.

22. The printed circuit board according to claim 21 wherein the polymeric layer is formed from a photodefinable polymeric material.

23. The printed circuit board according to claim 21 wherein the metallic layer and the metallic plate are formed of a copper.

24. The printed circuit board according to claim 21 wherein the waveguide is generally trapezoidal.

25. The printed circuit board according to claim 21 wherein the waveguide is generally rectangular.

26. The printed circuit board according to claim 21 wherein the polymeric layer has a first stratum adjacent the metallic layer and a second stratum adjacent to the trace, the first stratum and the second stratum having a combined dielectric thickness of greater than approximately 80 microns.

27. The printed circuit board according to claim 21 wherein the polymer layer is formed of a single stratum and has a thickness between 25 and 75 microns; and wherein the waveguide has an operational frequency of greater than 5 Gigahertz.

28. The printed circuit board of claim 21 wherein the horn antenna includes a connection section connected to the waveguide and a flared section remote from the waveguide.

29. The printed circuit board of claim 28 wherein the connection section includes a flange overlying the trace.

30. The printed circuit board of claim 29 wherein the horn antenna further comprises a fastener extending through the flange into the dielectric layer.

* * * * *